United States Patent
Lin et al.

(10) Patent No.: US 9,997,642 B2
(45) Date of Patent: Jun. 12, 2018

(54) DIODE, DIODE STRING CIRCUIT, AND ELECTROSTATIC DISCHARGE PROTECTION DEVICE HAVING DOPED REGION AND WELL ISOLATED FROM EACH OTHER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chun-Yu Lin, Hsinchu (TW); Ming-Dou Ker, Hsinchu County (TW); Wen-Tai Wang, Hsinchu County (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days. days.

(21) Appl. No.: 14/840,045

(22) Filed: Aug. 30, 2015

(65) Prior Publication Data

US 2016/0329318 A1    Nov. 10, 2016

(30) Foreign Application Priority Data

May 8, 2015 (TW) ............... 104114767 A (51) Int. Cl.
*H01L 29/861* (2006.01)
*H01L 29/749* (2006.01)
*H01L 27/02* (2006.01)

(52) U.S. Cl.
CPC ........ *H01L 29/861* (2013.01); *H01L 27/0255* (2013.01)

(58) Field of Classification Search
CPC ............... H01L 27/0266; H01L 29/861; H01L 27/0255; H01L 29/749; H01L 27/02; H01L 29/744; H01L 29/745; H01L 29/7455

See application file for complete search history.

(56) References Cited

U.S. PATENT DOCUMENTS

| 5,530,612 A | 6/1996 | Maloney |
| 5,874,338 A * | 2/1999 | Ferla ................. H01L 29/66712 257/E21.418 |

(Continued)

FOREIGN PATENT DOCUMENTS

| CN | 103646945 A | 3/2014 |
| TW | 390013 | 5/2000 |

(Continued)

OTHER PUBLICATIONS

S. Dabral, R. Aslett, and T. Maloney, "Designing on-chip power supply coupling diodes for ESD protection and noise immunity," in Proc. EOS/ESD Symp., 1993, pp. 239-249.

(Continued)

*Primary Examiner* — Fazli Erdem
(74) *Attorney, Agent, or Firm* — CKC & Partners Co., Ltd.

(57) ABSTRACT

A diode includes a substrate, a first insulating layer, a second insulating layer, a well, a deep doped region, a first doped region, and a second doped region. The first insulating layer is disposed on the substrate. The second insulating layer is disposed on the substrate, and defines a cell region with the first insulating layer. The well is disposed on the substrate and beneath the cell region. The deep doped region is disposed in the well and beneath the cell region. The first doped region is disposed in the cell region and on the deep doped region. The second doped region is disposed adjacent to the first doped region. The second doped region is (Continued)

disposed on the deep doped region, and is electrically isolated from the well through the deep doped region and the first doped region.

19 Claims, 4 Drawing Sheets

(56) References Cited

U.S. PATENT DOCUMENTS

| | | | |
|---|---|---|---|
| 6,671,153 B1 | 12/2003 | Ker et al. | |
| 6,972,476 B2 | 12/2005 | Chen et al. | |
| 7,002,216 B2 | 2/2006 | Huang | |
| 7,372,109 B2* | 5/2008 | Chen | H01L 27/0255 257/370 |
| 7,525,779 B2* | 4/2009 | Chen | H01L 27/0255 361/56 |
| 7,554,159 B2* | 6/2009 | Ker | H01L 27/0251 257/360 |
| 8,630,072 B2 | 1/2014 | Smith | |
| 8,829,618 B2 | 9/2014 | Pok et al. | |
| 2002/0122280 A1* | 9/2002 | Ker | H01L 27/0262 361/56 |
| 2006/0043417 A1* | 3/2006 | Terashima | H01L 29/063 257/197 |
| 2009/0014800 A1* | 1/2009 | Hwang | H01L 27/0262 257/355 |
| 2014/0034999 A1* | 2/2014 | Korec | H01L 29/7393 257/140 |
| 2015/0069424 A1 | 3/2015 | Willemen et al. | |
| 2016/0133731 A1* | 5/2016 | Song | H01L 29/735 257/579 |
| 2016/0268424 A1* | 9/2016 | Morgan | H01L 29/7831 |

FOREIGN PATENT DOCUMENTS

| | | |
|---|---|---|
| TW | 201104757 A | 2/2011 |
| TW | 201214669 A | 4/2012 |
| TW | 201431094 A | 8/2014 |

OTHER PUBLICATIONS

T. Maloney and S. Dabral, "Novel clamp circuits for IC power supply protection," IEEE Trans. Components, Packaging, and Manufacturing Technology, vol. 19, No. 3, pp. 150-161, Jul. 1996.

* cited by examiner

DIODE, DIODE STRING CIRCUIT, AND ELECTROSTATIC DISCHARGE PROTECTION DEVICE HAVING DOPED REGION AND WELL ISOLATED FROM EACH OTHER

RELATED APPLICATIONS

This application claims priority to Taiwan Application Serial Number 104114767, filed May 8, 2015, which is herein incorporated by reference.

BACKGROUND

Technical Field

The present disclosure relates to an electrostatic discharge (ESD) device. More particularly, the present disclosure relates to a diode of the ESD device.

Description of Related Art

Electrostatic discharge (ESD) protection devices have been widely applied to various electronic devices to improve reliability of the electronic devices.

In current ESD devices, a clamping circuit using diode strings is employed to provide the ESD protection. For example, a diode string circuit may be connected between a system voltage and ground, so as to provide a path for electrostatic discharging.

However, when implementing the diode string circuit in the current manufacture, the leakage current of the diode string circuit are increased due to current amplification caused from parasitic bipolar junction transistors (BJTs).

Moreover, in the current manufacture, when implementing the diode string circuit, a particular manufacturing process, for example, deep N-well, may be utilized. As a result, the layout area and the manufacturing cost are increased.

SUMMARY

An aspect of the present disclosure is to provide a diode. The diode includes a substrate, a first insulating layer, a second insulating layer, a well, a deep doped region, a first doped region, and a second doped region. The first insulating layer is disposed on the substrate. The second insulating layer is disposed on the substrate, and is configured to define a cell region with the first insulating layer. The well is disposed on the substrate and beneath the cell region. The deep doped region is disposed in the well and beneath the cell region. The first doped region has a first conductivity type, and is disposed in the cell region and on the deep doped region. The second doped region has a second conductivity type, and is disposed adjacent to the first doped region. The second doped region is disposed on the deep doped region, and is electrically isolated from the well through the deep doped region and the first doped region.

Another aspect of the present disclosure is to provide a diode string circuit. The diode string circuit includes a substrate, insulating layers, a well, a first diode, and a second diode. The insulating layers are disposed on the substrate and configured to define a first cell region and a second cell region. The well is disposed on the substrate, and is disposed underneath the first cell region and the second cell region. The first diode includes a first deep doped region, a first doped region, and a second doped region. The first deep doped region is disposed in the well and underneath the first cell region. The first doped region has a first conductivity type, and is disposed in the first cell region and on the first deep doped region. The second doped region has a second conductivity type, and is disposed on the first deep doped region and adjacent to the first doped region, and is electrically isolated from the well through the first deep doped region and the first doped region. The second diode includes a second deep doped region, a third doped region, and a fourth doped region. The second deep doped region is disposed in the well and underneath the second cell region. The third doped region has the second conductivity type, and is disposed in the second cell region and on the second deep doped region. The fourth doped region has the second conductivity type, and is disposed on the second deep doped region and adjacent to the third doped region, and is electrically isolated from the well through the second deep doped region and the third doped region.

Yet another aspect of the present disclosure is to provide an electrostatic discharge protection device. The electrostatic discharge protection device includes a substrate, a well, a diode, and a transistor. The well is disposed on the substrate. The diode includes a deep doped region, a first doped region, and a second doped region. The deep doped region is disposed in the well. The first doped region has a first conductivity type, and is disposed on the deep doped region. The second doped region has a second conductivity type, and is disposed adjacent to the first doped region and on the deep doped region, and is electrically isolated from the well through the deep doped region and the first doped region. The transistor is coupled to the first doped region of the diode.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure It will be understood that when an element is referred to as being another element, it can be directly on the other element or intervening elements may be present therebetween. In contrast, when an element is referred to as being "directly on" another element, there are no intervening elements present.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In this document, the term "coupled" may also be termed as "electrically coupled", and the term "connected" may be termed as "electrically connected." "Coupled" and "connected" may also be used to indicate that two or more elements cooperate or interact with each other.

Figure 1:
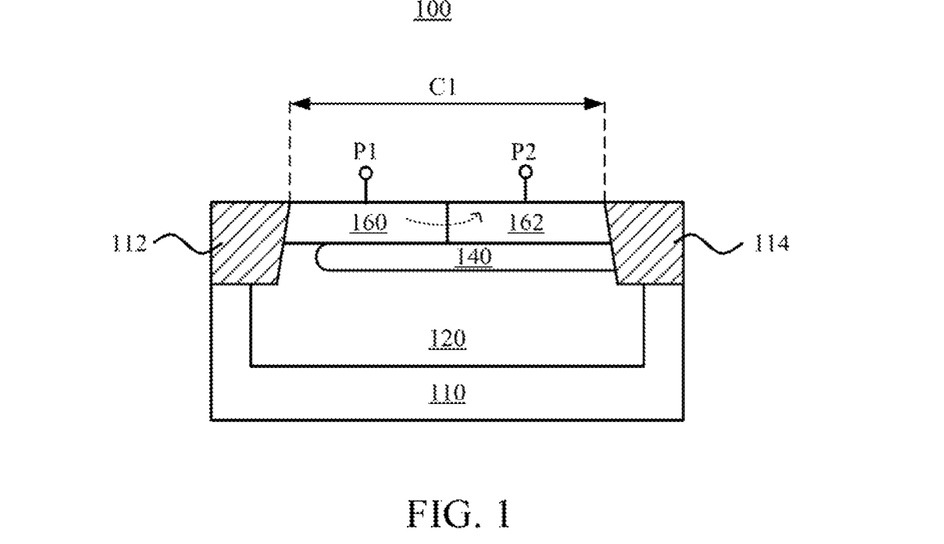
FIG. 1 is a cross-sectional view illustrating a schematic diagram of a diode according to some embodiments of the present disclosure.

Reference is now made to FIG. 1. FIG. 1 is a cross-sectional view illustrating a schematic diagram of a diode according to some embodiments of the present disclosure. As shown in FIG. 1, the diode 100 includes a substrate 110, an insulating layer 112, an insulating layer 114, a well 120, a deep doped region 140, a doped region 160, and a doped region 162.

In various embodiments, the substrate 110 is a P-type substrate. As shown in FIG. 1, the insulating layer 112 and the insulating layer 114 are disposed on the substrate 110 to define a cell region C1. In some embodiments, as shown in FIG. 1, the insulating layer 112 and the insulating layer 114 are implemented with shallow trench isolation. Alternatively, in some other embodiments, the insulating layer 112 and the insulating layer 114 are implemented with other electrical insulation materials, e.g., silicon nitride layers.

In this embodiment, the well 120 is an N-well. As shown in FIG. 1, the well 120 is disposed on the substrate 110 and underneath the cell region C1. The deep doped region 140 is disposed in the well 120. The doped region 160 has a first conductivity type, and is disposed in the cell region C1 The doped region 162 has a second conductivity type, and is disposed in the cell region C1. For example, in this embodiment, the doped region 160 is a P-type doped region, and the doped region 162 is an N-type doped region. The doped region 160 is coupled to an anode P1 of the diode 100. The doped region 162 is coupled to a cathode P2 of the diode 100, and is disposed adjacent to the doped region 160. As a result, carriers in the diode 100 can be transmitted between the P/N junctions through the dashed-line path. The doped region 160 and the doped region 162 are disposed on the deep doped region 140, and are in contact with the deep doped region 140. With such arrangement, the doped region 162 can be electrically insulated from the well 120 through the deep doped region 140 and the doped region 160.

Figure 4:
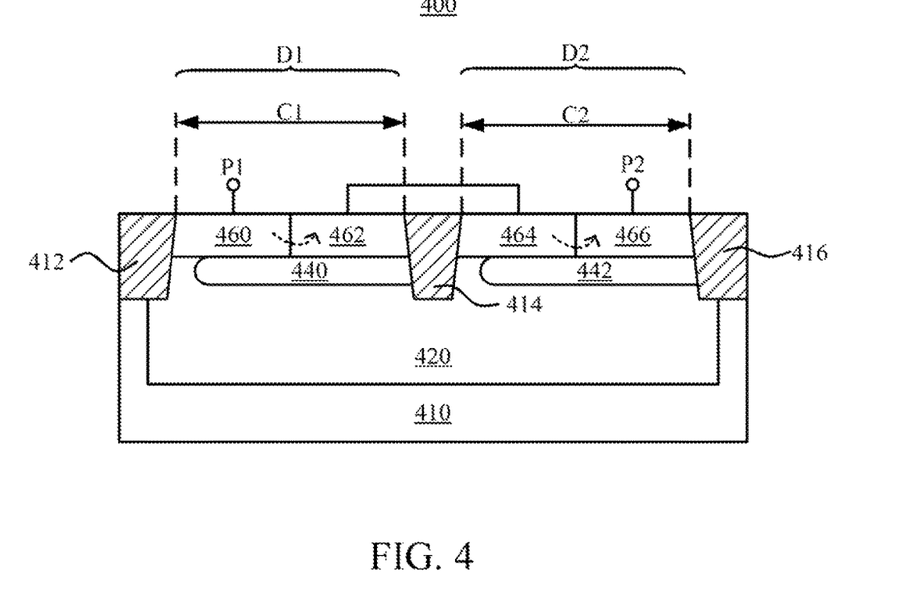
FIG. 4 is a cross-sectional view illustrating a schematic diagram of a diode string circuit according to some embodiments of the present disclosure.

In some embodiments, the deep doped region 140 is a P-type deep doped region, e.g., a P-electrostatic discharge (ESD) layer. For example, in a fabrication of complementary metal oxide semiconductor (CMOS), the ESD layer can be applied to various types of ESD protection devices, e.g., the aforementioned BJTs. By employing the deep doped region 140, the doped region 162 can be electrically isolated from the well 120. With such arrangement, the diode string circuit (as shown in FIG. 4 later) using the diode 100 can be disposed in the same well 120. Thus, the circuit area of the diode string circuit can be reduced without additional masks or complex manufacturing process (e.g., deep N-well). As a result, the manufacturing cost of the diode 100 can be significantly reduced. In addition, person skilled in the are is able to adjust the process parameter (e.g., the thickness) of the deep doped region 140 according to the requirements of actual applications, so as to adjust the device parameters (e.g., the threshold voltage, the breakdown voltage, etc.) of the diode 100.

Furthermore, in order to prevent from the impact caused by the leakage current of the parasitic BSI's, the well 120 is configured to receive a high voltage. With such arrangement, the leakage current of the diode 100 can be significantly reduced, and the unnecessary power consumption is thus saved.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 2A:
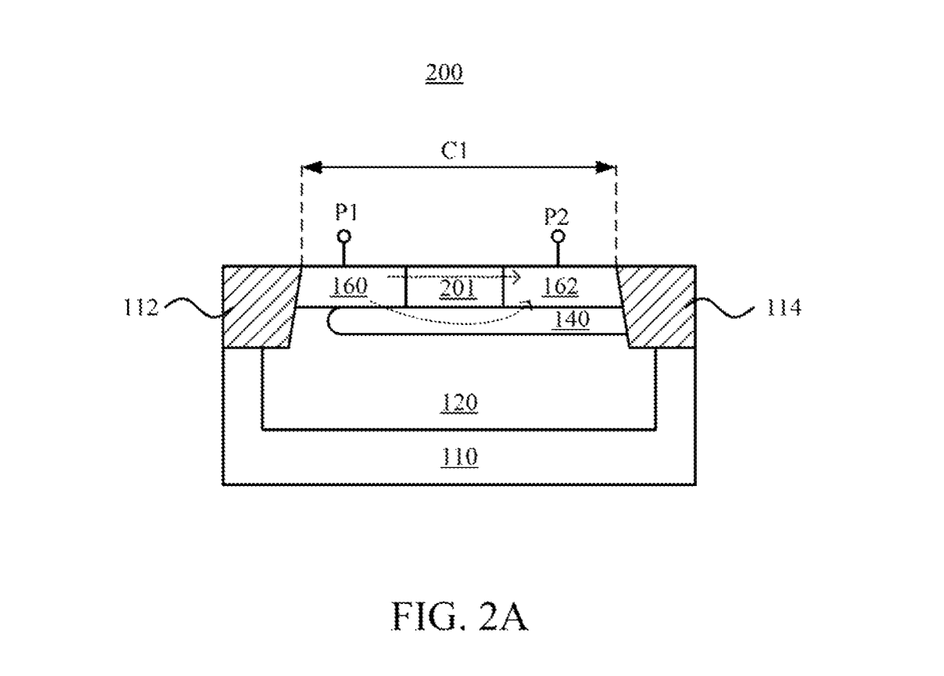
FIG. 2A is a cross-sectional view illustrating a schematic diagram of a diode according to some embodiments of the present disclosure.

Reference is now made to FIG. 2A. FIG. 2A is a cross-sectional view illustrating a schematic diagram of a diode according to some embodiments of the present disclosure. Compared to the diode 100, in this embodiment, the diode 200 further includes a spacing region 201. The spacing region 201 is disposed on the deep doped region 140 and between the doped region 160 and the doped region 162. As shown in FIG. 2A, the carriers in the diode 200 can be transmitted between the P/N junctions along the two dashed-line paths. In some embodiments, the spacing region 201 can be directly formed by the well 120 without additional doping. Alternatively, in some embodiments, the spacing region 201 is a light doped region, in which the conductivity type of the light doped region and that of the well 120 are the same.

Figure 2B:
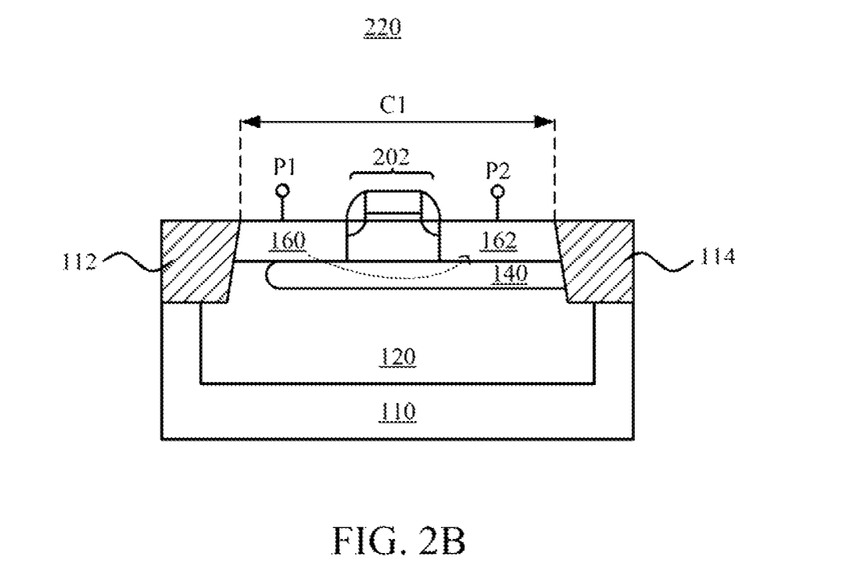
FIG. 2B is a cross-sectional view illustrating a schematic diagram of a diode according to some embodiments of the present disclosure.

Reference is now made to FIG. 2B. FIG. 2B is a cross-sectional view illustrating a schematic diagram of a diode according to some embodiments of the present disclosure. Compared to the diode 100 in FIG. 1, in this embodiment, the diode 220 further includes a gate electrode 202. The gate electrode 202 is disposed on the cell region C1 and between the doped region 160 and the doped region 162. In various embodiments, the gate electrode 202 can be a poly-silicon layer.

Figure 3:
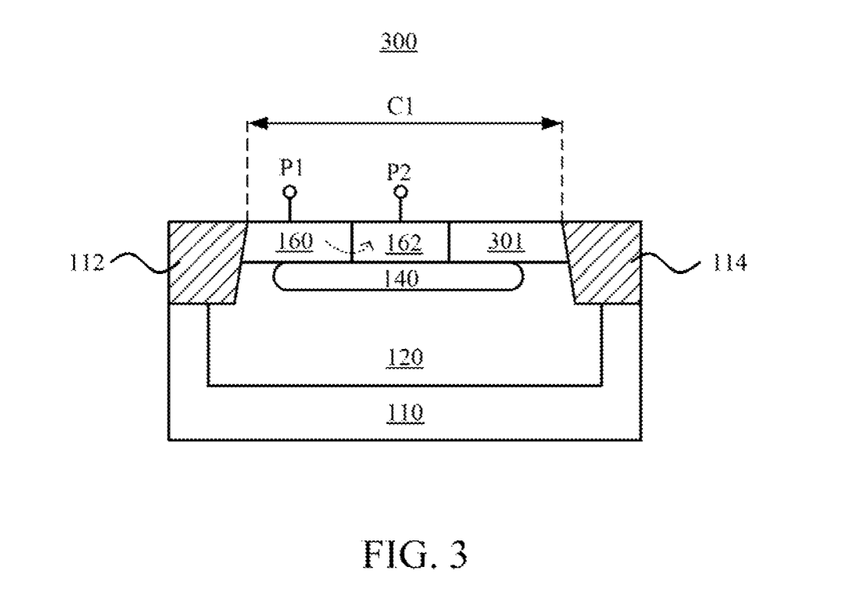
FIG. 3 is a cross-sectional view illustrating a schematic diagram of a diode according to some embodiments of the present disclosure.

Reference is now made to FIG. 3. FIG. 3 is a cross-sectional view illustrating a schematic diagram of a diode according to some embodiments of the present disclosure. Compared to the diode 100 shown in FIG. 1, in this embodiment, the diode 300 further includes a doped region 301. The doped region 301 and the doped region 160 are configured to have the same conductivity type. For example, both of the doped region 301 and the doped region 160 are P-type doped regions. In this embodiment, the doped region 162 is disposed between the doped region 160 and the doped region 301, so as to be electrically isolated from the well 120 through the deep doped region 140, the doped region 160, and the doped region 301.

Reference is now made to FIG. 4. FIG. 4 is a cross-sectional view illustrating a schematic diagram of a diode string circuit according to some embodiments of the present disclosure. The diode 100, the diode 200, the diode 220, or the diode 300 illustrated in the previous embodiments can be further applied to a diode string circuit. As shown in FIG. 4, the diode circuit 400 includes a substrate 410, an insulating layer 412, an insulating layer 414, an insulating layer 416, a well 420, a deep doped region 440, a deep doped region 442, a doped region 460, a doped region 462, a doped region 464, and a doped region 466.

In this embodiment, the substrate 410 is a P-type substrate. The insulating layer 412 the insulating layer 414, and the insulating layer 416 are disposed on the substrate 410, in which the insulating layer 412 and the insulating layer 414 are configured to define the cell region C1, and the insulating layer 414 and the insulating layer 416 are configured to define a cell region C2. In this embodiment, the well 420 is an N-well, and is disposed on the substrate 410 and underneath the cell region C1 and the cell region C2. In some embodiments, as mentioned above, the well 420 is configured to receive a high voltage.

In this embodiment, the diode D1, i.e., the deep doped region 440, the doped region 460, and the doped region 462, is configured to be disposed in the cell region C1, and the diode D2, i.e., the deep doped region 442, the doped region 464, and the doped region 466, is configured to be disposed in the cell region C2.

In this embodiment, the deep doped region 440 and the deep doped region 442 are P-type deep doped region. In greater detail, the deep doped region 440 is disposed in the well 420 and underneath the cell region C1. The doped region 460 and the doped region 464 are P-type doped regions, and the doped region 462 and the doped region 466 are N-type doped regions. The doped region 460 is disposed in the cell region C1 and on the deep doped region 440. The doped region 462 is disposed in the cell region C1 and on the deep doped region 440. As shown in FIG. 4, in this embodiment, the doped region 462 is disposed adjacent to the doped region 460 and between the doped region 460 and the insulating layer 414. As a result, the doped region 462 is able to be electrically insulated from the well 420 through the deep doped region 440, the doped region 460, and the insulating layer 414.

Furthermore, the deep doped region 442 is disposed in the well 420 and underneath the cell region C2. The doped region 464 is disposed in the cell region C2 and on the deep doped region 442. The doped region 464 is electrically connected to the doped region 462 through a wire, so as to form the diode string. The doped region 466 is disposed in the cell region C2 and on the deep doped region 442. The doped region 466 is disposed adjacent to the doped region 464 and between the doped region 464 and the insulating layer 416. As a result, the doped region 466 is able to be electrically insulated from the well 420 through the deep doped region 442, the doped region 464, and the insulating region 416.

As mentioned above, by employing the deep doped region 440 and the deep doped region 442, the diode D1 and the diode D2 of the diode string circuit 400 can be disposed in the same well 420. Accordingly, the layout area for the diode string circuit 400 can be significantly reduced, and thus the manufacturing cost can be saved.

It is noted that, for illustrative purpose, the diode string circuit 400 in FIG. 4 only described with the structure of the diode 100 in FIG. 1, but the present disclosure is not limited in this regard. For example, in some embodiment, the diode D1 or the diode D2 of the diode string circuit 400 can be implemented with the diode 200 shown in FIG. 2A. In some other embodiments, the diode D1 or the diode D2 of the diode string circuit 400 can be implemented with the diode 220 shown in FIG. 2B. Alternatively, in yet some embodiments, the diode D1 or the diode D2 of the diode string circuit 400 can be implemented with the diode 300 shown in FIG. 3.

Figure 5A:
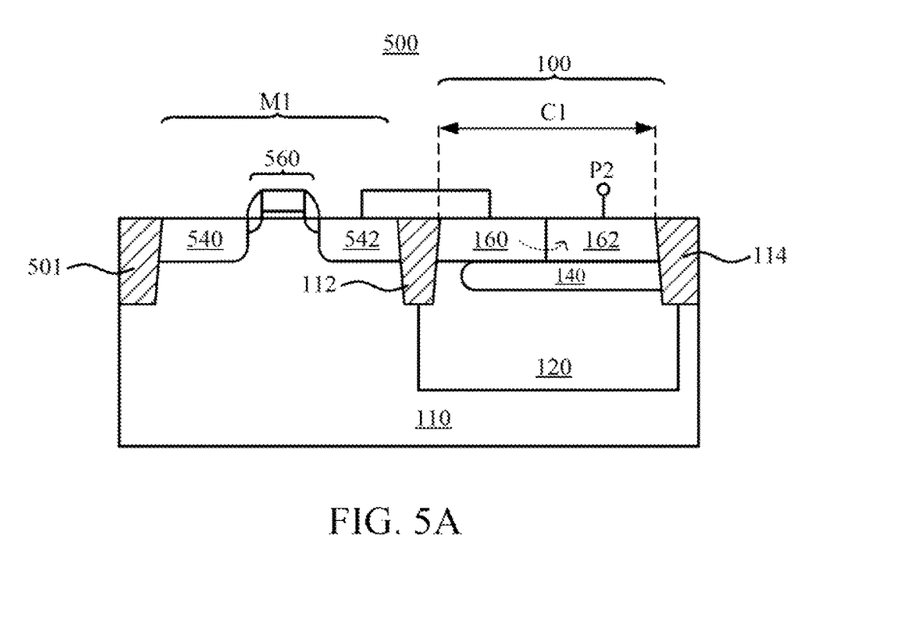
FIG. 5A is a cross-sectional view illustrating a schematic diagram of an ESD protection device according to some embodiments of the present disclosure.

Reference is now made to FIG. 5A. FIG. 5A is a cross-sectional view illustrating a schematic diagram of an ESD protection device according to some embodiments of the present disclosure. In various embodiments, the diode 100, the diode 200, the diode 220, or the diode 300 can be further applied to ESD protection devices. As shown in FIG. 5A, the ESD protection device 500 includes an insulating layer 501, an N-type field effect transistor (FET) M1 and the diode 100. The N-type FET M1 is disposed between the insulating layer 501 and the insulating layer 112. The N-type FET M1 includes a doped region 540, a doped region 542, and a gate electrode 560, in which the doped region 540 and the doped region 542 are N-type doped regions. The gate electrode 560 is disposed between the doped region 540 and the doped region 542, and is disposed on the substrate 110. The doped region 532 is further electrically connected to the diode 100 through a wire. In other words, the N-type FET M1 is coupled to the diode 100 in series. As the structure of the diode 100 is similar with FIG. 1, the repetitious descriptions are not given here. With such arrangement, the diode 100 can be fabricated with the N-type FET M1 in the same manufacturing process, so as to implement various types of ESD devices.

Figure 5B:
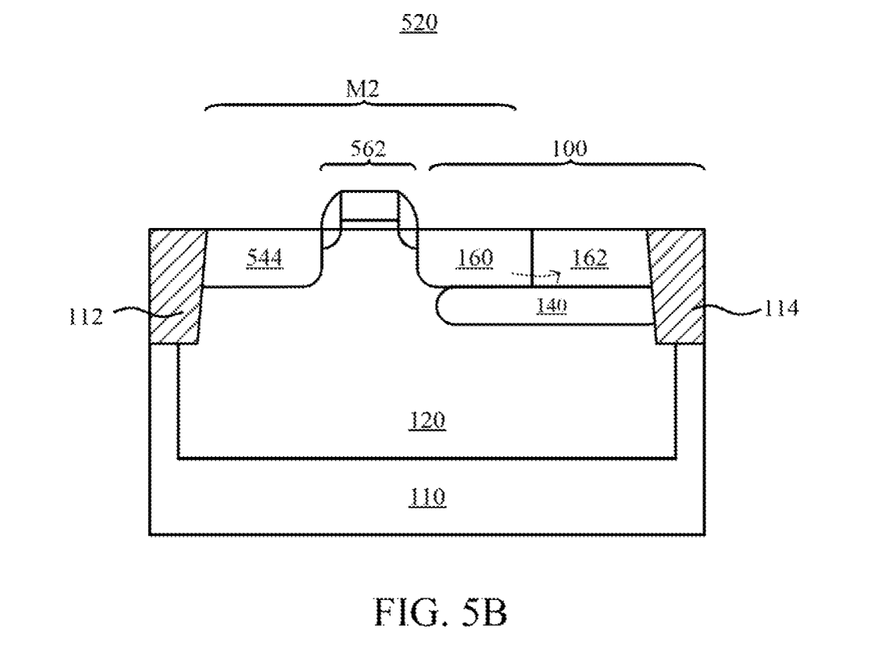
FIG. 5B is a cross-sectional view illustrating a schematic diagram of an ESD protection device according to some embodiments of the present disclosure.

Reference is now made to FIG. 5B. FIG. 5B is a cross-sectional view illustrating a schematic diagram of an ESD protection device according to some embodiments of the present disclosure. Compared to the ESD device 500 shown in FIG. 5A, in this embodiment, the ESD protection device 520 includes a P-type FET M2 and a diode 100. As shown in FIG. 5B, the P-type FET M2 includes a doped region 544 and a gate electrode 562, in which the doped region is a P-type doped region. The doped region 544 and the gate electrode 562 are disposed between the insulating layer 112 and the doped region 160, and the P-type FET M2 and the diode 100 are configured to share the doped region 160. In other words, with such arrangement, the P-type FET M2 can be electrically coupled to the diode 100 in series without additional wires. As a result, the layout area of the ESD protection device 520 can be further reduced.

The descriptions are described with a single FET and the diode 100, which are connected in series, to illustrate arrangements for applying the diode 100 to ESD protection devices, but the present disclosure is not limited in this regard. Person skilled in the art is able to adjust the number of the transistors or the diodes in the ESD protection device 500 or the ESD protection device 520 according to requirements of actual applications.

Aforementioned embodiments are described only with the P-type deep doped region, but the present disclosure is not limited in this regard. It is understood that the diode in the various embodiments also can be implemented with the N-type deep doped region.

Figure 6:
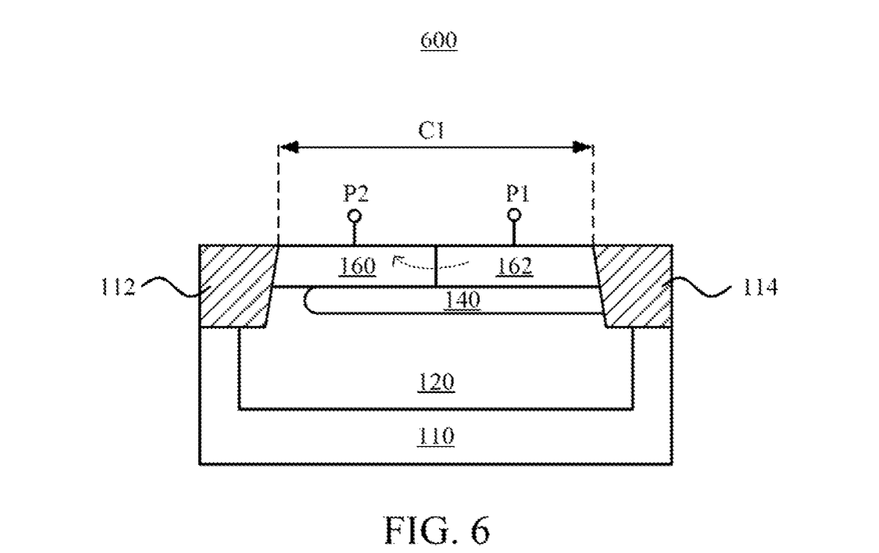
FIG. 6 is a cross-sectional view illustrating a schematic diagram of a diode according to some embodiments of the present disclosure.

Reference is now made to FIG. 6. FIG. 6 is a cross-sectional view illustrating a schematic diagram of a diode according to some embodiments of the present disclosure. Compared to the diode 100 shown in FIG. 1, the deep doped region 140 in the diode 600 is an N-type deep doped region. Correspondingly, the well 120 is a P-well, the doped region 160 is an N-type doped region and is coupled to the cathode P2, and the doped region 162 is a P-type doped region and is coupled to the anode P1. As a result, the doped region 162 and the doped region 160 form a PN junction in the diode 600, and the doped region 162 is electrically insulated from the well 120 through the deep doped region 140 and the doped region 160. In other words, in various embodiments, the conductivity type of the well 120 is configured to be different from the conductivity type of the deep doped region 140.

In summary, the diode and the diode string circuit of the present disclosure are able to be applied to various types of ESD devices. By employing the deep doped region, the leakage current of the diode of the present disclosure can be significantly reduced. Further, as the diodes of the diode strings can be disposed in the same well, the layout area is accordingly reduced, and thus the manufacturing cost is saved.

It will be apparent to those skilled in the art that various modifications and variations can be made to the structure of the present disclosure without departing from the scope or spirit of the disclosure. In view of the foregoing, it is intended that the present disclosure cover modifications and variations of this closure provided they fall within the scope of the following claims.

What is claimed is:
1. A diode, comprising:
   a substrate;
   a first insulating layer disposed on the substrate;
   a second insulating layer disposed on the substrate, wherein the second insulating layer is configured to define a cell region with the first insulating layer;
   a well having a first conductivity type, the well being disposed on the substrate and beneath the cell region;
   a deep doped region having a second conductivity type, the deep doped region being disposed in the well and beneath the cell region;
   a first doped region having the second conductivity type, wherein the first doped region is disposed in the cell region and on the deep doped region, the deep doped region extends only partially under the first doped region, and the first doped region directly contacts both of the well and the deep doped region; and
   a second doped region having the first conductivity type, wherein the second doped region is disposed adjacent to the first doped region;
   wherein the second doped region is disposed on the deep doped region, and is electrically isolated from the well through the deep doped region and the first doped region.

2. The diode of claim 1, further comprising:
   a spacing region disposed on the deep doped region and between the first doped region and the second doped region.
3. The diode of claim 1, further comprising:
   a gate electrode disposed on the cell region and between the first doped region and the second doped region.
4. The diode of claim 1, further comprising:
   a third doped region having the second conductivity type, wherein the third doped region is disposed on the deep doped region, the second doped region is disposed between the first doped region and the third doped region, and is electrically isolated from the well through the deep doped region, the first doped region, and the third doped region.
5. The diode of claim 1, wherein the second doped region directly contacts the deep doped region.
6. A diode string circuit, comprising:
   a substrate;
   a plurality of insulating layers disposed on the substrate and configured to define a first cell region and a second cell region;
   a well disposed on the substrate, wherein the well is disposed underneath the first cell region and the second cell region;
   a first diode comprising:
      a first deep doped region disposed in the well and underneath the first cell region;
      a first doped region having a first conductivity type, wherein the first doped region is disposed in the first cell region and on the first deep doped region, the first deep doped region extends only partially under the first doped region, and the first doped region directly contacts both of the well and the first deep doped region; and
      a second doped region having a second conductivity type, wherein the second doped region is disposed on the first deep doped region and adjacent to the first doped region, and is electrically isolated from the well through the first deep doped region and the first doped region; and
   a second diode comprising:
      a second deep doped region disposed in the well and underneath the second cell region;
      a third doped region having the first conductivity type, and coupled to the second doped region, wherein the third doped region is disposed in the second cell region and on the second deep doped region, the second deep doped region extends only partially under the third doped region, and the third doped region directly contacts both of the well and the second deep doped region; and
      a fourth doped region having the second conductivity type, wherein the fourth doped region is disposed on the second deep doped region and adjacent to the third doped region, and is electrically isolated from the well through the second deep doped region and the third doped region.
7. The diode string circuit of claim 6, further comprising:
   a spacing region disposed between the first doped region and the second doped region.
8. The diode string circuit of claim 6, further comprising:
   a spacing region disposed between the third doped region and the fourth doped region.
9. The diode string circuit of claim 6, further comprising:
   a fifth doped region having the first conductivity type, wherein the fifth doped region is disposed on the first deep doped region and between the second doped region and a first one of the insulating layers, and the second doped region is electrically insulated from the well through the first deep doped region and the fifth doped region.

10. The diode string circuit of claim 6, further comprising:
a fifth doped region having the first conductivity type, wherein the fifth doped region is disposed on the second deep doped region and between the fourth doped region and a second one of the insulating layers, and the fourth doped region is electrically insulated from the well through the second deep doped region and the fifth doped region.

11. The diode string circuit of claim 6, wherein the second doped region directly contacts the first deep doped region.

12. The diode string circuit of claim 6, wherein the fourth doped region directly contacts the second deep doped region.

13. An electrostatic discharge protection device, comprising:
a substrate;
a well having a first conductivity type, the well being disposed on the substrate;
a diode comprising:
a deep doped region having a second conductivity type, the deep doped region being disposed in the well;
a first doped region having the second conductivity type, wherein the first doped region is disposed on the deep doped region, the deep doped region extends only partially under the first doped region, and the first doped region directly contacts both of the well and the deep doped region; and
a second doped region having the first conductivity type, wherein the second doped region is disposed adjacent to the first doped region and on the deep doped region, and is electrically isolated from the well through the deep doped region and the first doped region; and
a transistor coupled to the first doped region of the diode.

14. The electrostatic discharge protection device of claim 13, further comprising:
a first insulating layer disposed in the well;
a second insulating layer disposed in the well, wherein the transistor is disposed between the first insulating layer and the second insulating layer; and
a third insulating layer disposed in the well, wherein the diode is disposed between the second insulating layer and the third insulating layer.

15. The electrostatic discharge protection device of claim 14, wherein the transistor comprises:
a third doped region having the first conductivity type, wherein the third doped region is disposed adjacent to the first insulating layer;
a fourth doped region having first conductivity type, wherein the fourth doped region is disposed adjacent to the second insulating layer; and
a gate electrode disposed on the well and between the third doped region and the fourth doped region;
wherein the fourth doped region is coupled to the first doped region through a wire.

16. The electrostatic discharge protection device of claim 13, further comprising:
a first insulating layer disposed in the well; and
a second insulating layer disposed in the well, wherein the transistor and the diode are is disposed between the first insulating layer and the second insulating layer, and the transistor and the diode are configured to share the first doped region.

17. The electrostatic discharge protection device of claim 16, wherein the transistor comprises:
a third doped region having the second conductivity type, wherein the third doped region is disposed adjacent to the first insulating layer, and the second doped region is disposed adjacent to the second insulating layer; and
a gate electrode disposed on the well and between the third doped region and the first doped region.

18. The diode of claim 1, wherein the first doped region is disposed at a first location above the deep doped region, the second doped region is disposed at a second location above the deep doped region, and both of the first location and the second location are arranged along the same horizontal level that is in substantially parallel with the deep doped region.

19. The electrostatic discharge protection device of claim 13, wherein the first doped region is disposed at a first location above the deep doped region, the second doped region is disposed at a second location above the deep doped region, and both of the first location and the second location are arranged along the same horizontal level that is in substantially parallel with the deep doped region.

* * * * *